United States Patent [19]

Morito

[11] Patent Number: 4,591,742
[45] Date of Patent: May 27, 1986

[54] OUTPUT CIRCUIT CAPABLE OF BEING CONNECTED TO ANOTHER CIRCUIT HAVING TRANSISTORS OF ANY CONDUCTION TYPE

[75] Inventor: Hiroshi Morito, Tokyo, Japan

[73] Assignee: NEC Corporation, Tokyo, Japan

[21] Appl. No.: 492,916

[22] Filed: May 9, 1983

[30] Foreign Application Priority Data

May 7, 1982 [JP] Japan .................. 57-76180

[51] Int. Cl.[4] ......................................... H03K 17/687
[52] U.S. Cl. ................... 307/475; 307/448; 307/454; 307/471
[58] Field of Search ............... 307/443, 446, 448, 454, 307/465, 471, 475, 549, 550, 572, 579, 255, 270; 365/190, 202

[56] References Cited

U.S. PATENT DOCUMENTS

| 3,914,590 | 10/1975 | Irwin et al. | 307/471 X |
| 3,935,476 | 1/1976 | Paluck | 307/471 X |
| 3,953,748 | 4/1976 | Sugiura et al. | 307/443 X |
| 4,032,795 | 6/1977 | Hale | 307/446 X |
| 4,096,398 | 6/1978 | Khaitan | 307/475 |
| 4,157,480 | 6/1979 | Edwards | 307/465 |
| 4,337,522 | 6/1982 | Stewart | 365/190 |
| 4,417,161 | 11/1983 | Uya | 307/471 |
| 4,419,593 | 12/1983 | Butler et al. | 307/475 X |
| 4,488,066 | 12/1984 | Shoji | 307/443 X |

Primary Examiner—Stanley D. Miller
Assistant Examiner—D. R. Hudspeth
Attorney, Agent, or Firm—Sughrue, Mion, Zinn, Macpeak & Seas

[57] ABSTRACT

An integrated circuit having a signal terminal 13 and a reference terminal 14, an output transistor $Q_4$ connected across these terminals with its gate or base connected to the output of exclusive OR gate 12, and an internal circuit 110 with its input port connected to the signal terminal and its output terminal connected to one of the inputs of the OR gate. The other OR-gate input is connected to the reference terminal. By applying the proper reference voltage to the reference terminal, the signal terminal can operate as an I/O terminal with another integrated circuit of the same or of different conductivity type.

13 Claims, 12 Drawing Figures

OUTPUT CIRCUIT CAPABLE OF BEING CONNECTED TO ANOTHER CIRCUIT HAVING TRANSISTORS OF ANY CONDUCTION TYPE

BACKGROUND OF THE INVENTION

The present invention relates to an output section of an integrated logic circuit, and particularly to an input-/output section through which a logic input or output signal is transferred from the outside into the internal logic circuit or from the latter to the outside.

In accordance with the recent development of electronics, the application field thereof is being rapidly broadened and also demand for diversification of circuits is increased. In the prior art, an N-channel type integrated circuit sufficed only to be connected to a transistor of the same conduction type, that is, N-channel type field effect transistor. However, because of this diversification it has become sometimes necessary for the N-channel field effect transistor to be connected to a transistor of a different conduction type, that is, P-channel type field effect transistor. However, it is not always easy to connect integrated circuits having transistors of different conduction types to each other.

For instance, in some cases, exchange of data is effected bidirectionally between a microprocessor IC and a memory IC or an I/O controller IC through a data bus line. More particularly, output transistors are provided within the respective IC's and the output signals of the respective IC's are transferred to the data bus line via the respective output transistors, while input signals from the data bus line are directly supplied to the respective IC's through respective external input/output terminals of the IC's to which the respective output transistors are connected, but not through the output transistors. With such input/output section, the output transistor of the IC is kept cut-off when that IC receives a signal from the data bus, and the signal is transmitted into the data bus from an output transistor of another IC.

Such a direct connection via the data bus line can be easily formed where the connected IC's have their output transistors of the same conduction type. Where the respective output transistors are of different conduction types, however, the direct connection cannot be formed unless an inverter is specially added to one of the output sections. Since the conduction type of the output transistor is usually the same as that of the transistors employed in the IC's, the polarity of an IC which can be connected to another IC is determined by the polarity of the latter IC. In other words, it was impossible to interconnect IC's having transistors of any arbitrary type of conductivity.

SUMMARY OF THE INVENTION

It is a major object of the present invention to provide an output circuit which can exchange signals with the other circuit regardless of the type of a component device (whether P-channel type or N-channel type of a field effect transistor or alternatively whether PNP type or NPN type of a bipolar transistor) in the other circuit.

According to one feature of the present invention, there is provided an integrated logic circuit comprising a control potential terminal, a power supply potential terminal, a signal input/output terminal, a logic circuit portion having an input end and an output end, an exclusive OR circuit having its one input end connected to the output end of the logic circuit portion and the other input end thereof connected to the control potential terminal, an output transistor adapted to receive the output of the exclusive OR circuit at its input electrode and having its output electrode connected to the signal input/output terminal and its common electrode connected to the control potential terminal, and means for coupling the signal input/output terminal with the input end of the logic circuit portion. In place of the exclusive OR circuit, an exclusive NOR circuit can be used.

The signal input/output terminal of the integrated logic circuit according to the present invention is connected to a data bus line which is in turn connected to an input/output terminal of the other IC. If the output transistor of the other IC has the same conduction type as the output transistor in the integrated logic circuit according to the present invention, then the one input end of the exclusive OR (NOR) circuit is supplied via the control potential terminal with "0"-level potential (or "1"-level potential in case of exclusive NOR), and hence the exclusive OR (NOR) circuit acts as a non-inverter. In this instance, since the output transistor receiving the output of the exclusive OR (NOR) operates as a drain follower or a collector follower, that is an inverter, the output signal is transferred to the data bus after inverted by the output transistor. Therefore, the output transistor connected to the output terminal in the other IC and the output transistor in the integrated logic circuit jointly operate as a conventional wired NOR circuit.

On the other hand, in the case where the output transistors in the two interconnected IC's have different types of conductivities, the control potential terminal is supplied with a reference potential of the other IC (that is, to "1"-level potential of the integrated logic circuit according to the present invention). In this instance, the exclusive OR circuit acts as an inverter. With "0" level potential, the exclusive NOR circuit acts as an inventor. On the other hand, the output transistor connected to the output of the exclusive OR (NOR) circuit forms a conventional wired NOR circuit jointly with the output transistor of the other IC, and so, transfer of a signal via the data bus becomes possible. In this instance, the output does not invert the output of the exclusive OR (NOR) because it operates as a source follower or an emitter follower in an inverse transistor action.

As described above, according to the present invention, the output transistor receiving the output of the exclusive OR (NOR) circuit can constitue a wired NOR circuit even with a transistor having a different conduction type from that of the first-mentioned transistor and the conduction type of the output transistor in the IC to be connected to the integrated logic circuit according to the present invention is not limited.

BRIEF DESCRIPTION OF THE DRAWINGS

The above and further objects, features and advantages of the present invention will become more apparent from the following detailed description of embodiments taken in conjunction with the accompanying drawings, wherein.

DETAILED DESCRIPTION OF THE INVENTION

At first, it will be explained that, although a direct connection via a data bus line can be constituted between output transistors of the same conduction type, it cannot be constituted between output transistors of different conduction types in the prior art IC's.

Figure 1:
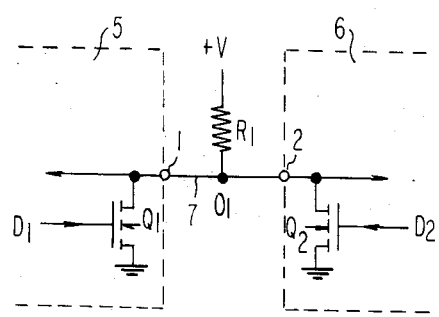
FIG. 1 is a circuit diagram showing a direct connection between output transistors of the same conduction type in prior art IC's.

Referring to FIG. 1, an integrated circuit 5 which forms, e.g., a microprocessor has an output tansistor $Q_1$ of an N-channel field effect transistor (hereinafter abbreviated as N-FET). The output signal $D_1$ of the IC 5 is supplied to the gate of the output transistor $Q_1$ whose drain is connected to an input/output terminal 1 of the IC 5 and whose source is grounded. The input/output terminal 1 is also connected to an input section (not shown) of the IC 5. Another integrated circuit 6 which forms, e.g., a memory also has an output transistor $Q_2$ of N-FET with a gate supplied with an output signal $D_2$ of the IC 6, a source grounded and a drain connected to an input/output terminal 2 of the IC 6. The two terminals 1 and 2 of the IC's 5 and 6 are directly connected by a data bus line 7 and also to a positive voltage source $+V$ via a pull-up resistor $R_1$. The resultant connection of the two output transistors $Q_1$ and $Q_2$ and the positive voltage source $+V$ forms a wired NOR circuit with the input data $D_1$ and $D_2$ and one output $O_1$. Data $D_1$ is the output of the IC 5 applied to the gate of the N-FET $Q_1$, while the data $D_2$ is the output of the IC 6 applied to the gate of the N-FET $Q_2$. The output $O_1$ of the thus formed wired NOR circuit fulfils a truth table shown in Table-1 below.

TABLE 1

| $D_1$ | $D_2$ | $O_1$ |
|---|---|---|
| 0 | 0 | 1 |
| 0 | 1 | 0 |
| 1 | 0 | 0 |
| 1 | 1 | 0 |

Accordingly, transfer of the output data $D_1$ of the IC 5 to the IC 6 via the output transistor $Q_1$, which inverts $D_1$, and via the data bus line 7 becomes possible by maintaining the data $D_2$ at "0". Also, transfer of the output data $D_2$ of the IC 6 to the IC 5 via the output transistor $Q_2$ and the bus line 7 is possible by maintaining the data $D_1$ at "0".

Figure 2:
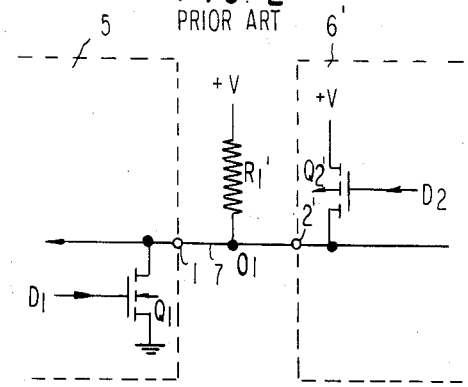
FIG. 2 is a circuit diagram showing a direct connection of output transistors of different conduction types in prior art IC's.

Now referring to FIG. 2, the N-FET IC 5 is sometimes required to exchange data with a P-FET IC 6' having an output transistor $Q_2'$ of P-FET. The gate of the P-FET $Q_2'$ receives the output data $D_2$ of the P-FET IC 6' and its drain is connected to an input/output terminal 2' of the IC 6', while its source is applied with a voltage $+V$. In such case, even though the two terminals 1 and 2' are interconnected by the bus line 7 and connected to a potential $+V$ via a pull-up resistor $R_1'$, a wired NOR function cannot be obtained between the input data $D_1$, $D_2$ and the output $O_1$. When it is intended to transfer the data $D_1$ to the IC 6', it can be achieved by maintaining the P-FET $Q_2'$ at a cut-off condition. However, to transfer the data $D_2$ to the IC 5 is impossible, because even if the N-FET $Q_1$ is maintained at a cut-off condition for that purpose, an output $O_1$ always becomes $+V$ regardless of the condition of the P-FET $Q'_2$. If the N-FET $Q_1$ is maintained at an ON condition, then the output $O_1$ cannot take $+V$ potential, because it is forced to stay at the ground potential. Therefore, it is impossible to transfer the data from the P-FET IC 6' to the N-FET IC 5.

Though it has been proposed to insert a pull-down resistor for the P-FET $Q_2'$ between the terminal 2' and the ground as a countermeasure for the above-mentioned problem, in this case the logic operation range of the circuit is reduced to a difference between the threshold voltages of the N-FET $Q_1$ and the P-FET $Q_2'$, and hence the operation becomes unstable.

Figure 3:
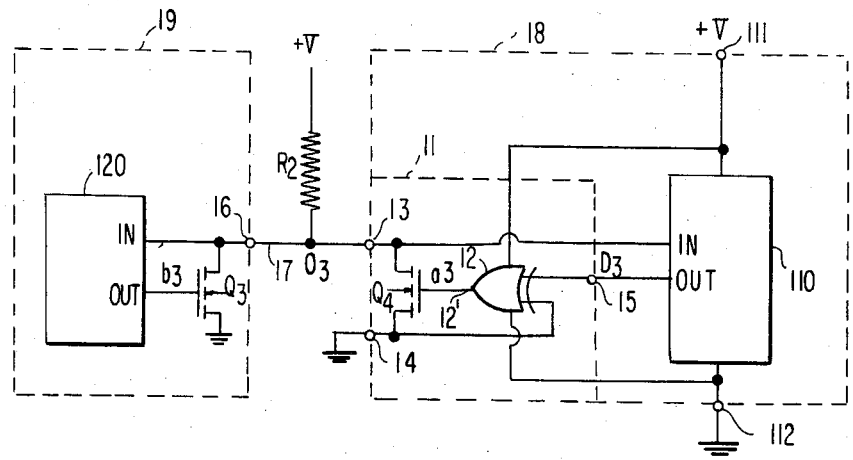
FIG. 3 is a circuit diagram of an IC according to a first preferred embodiment of the present invention having an N-channel type field-effect output transistor in the case where an input/output terminal of the IC is connected to another IC having an output transistor of the same conduction type.

Referring to FIG. 3, an N-FET integrated logic circuit 18 according to a first preferred embodiment of the present invention comprises an input/output terminal 13, a reference terminal 14, a first power supply terminal 111, a second power supply terminal 112, a logic circuit 110 such as, for example, a microprocessor having a data input end IN connected to the input/output terminal 13 and a data output end OUT, and an output circuit 11 formed of N-FET's. The output circuit 11 includes an output transistor $Q_4$ of N-FET connected between the input/output terminal 13 and the reference terminal 14 and an exclusive OR circuit 12 having two input ends, one 15 being connected to the output end OUT of the logic circuit 110 and the other being connected to the reference terminal 14, and one output end 12' connected to the gate of the output transistor $Q_4$. The input/output terminal 13 serves as an output terminal for the output data via the output circuit 11 from the output end of the logic circuit 110 and also serves as an input terminal for the input data to be supplied to the input end of the logic circuit 110.

Figure 9:
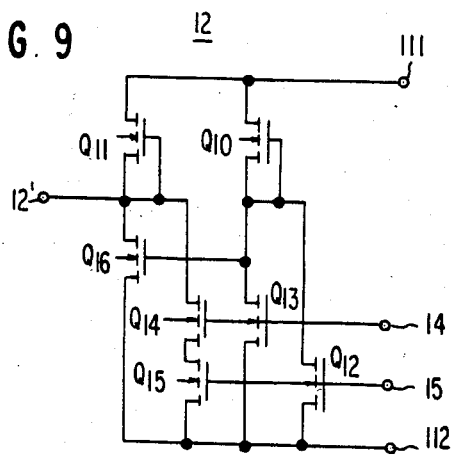
FIGS. 9 and 10 are circuit diagrams of examples of the exclusive OR circuit to be used in the N-channel MOS IC according to the first embodiment.

One example of the exclusive OR circuit 12 is shown in FIG. 9. A depletion type N-FET $Q_{10}$ operating as a load and two parallelconnected enhancement-type N-

Figure 10:
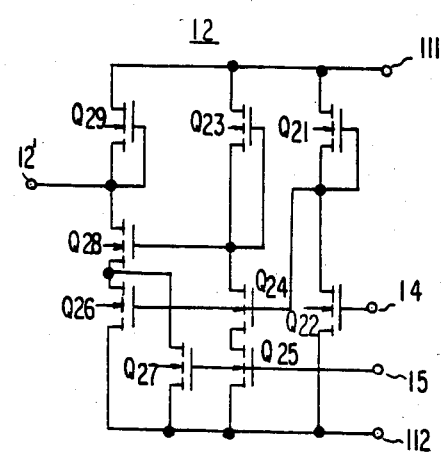

FET's $Q_{12}$ and $Q_{13}$ are connected in series between the first and second power supply terminals 111 and 112 of the IC 18 (FIG. 3) to form an AND-gate with two inputs 14 and 15 which are also applied to series-connected enhancement type N-FET's $Q_{14}$ and $Q_{15}$ forming a NOR-gate. This NOR-gate and another enhancement-type N-FET $Q_{16}$ receiving the output of the AND gate of $Q_{12}$ and $Q_{13}$ are connected in parallel between the first power supply terminal 111 via a depletion type N-FET load $Q_{11}$ and the second power supply terminal 112 to form a NOR gate, and the exclusive OR output is obtained at an output end 12' connected to the junction point of the load $Q_{11}$ and the NOR-forming transistors $Q_{16}$ and $Q_{14}$–$Q_{15}$. FIG. 10 shows another example of the exclusive OR circuit 12 employing N-FET's, which consists of an inverter gate comprised of N-FET's $Q_{21}$ and $Q_{22}$, an OR gate comprised of N-FET's $Q_{23}$ $Q_{24}$ and $Q_{25}$, a NAND gate comprises of N-FET's $Q_{26}$ and $Q_{27}$ and a NAND gate comprises of the NAND gate and N-FET's $Q_{28}$ and $Q_{29}$.

Now referring back to FIG. 3, description will be made of the case where the N-FET IC 18 of the first enbodiment of the invention is connected to another IC 19 having an output transistor $Q_3$ of the same conduction type (N-channel type).

An IC 19 to be connected to the N-FET IC 18 includes a logic signal circuit 120 such as a memory and the N-FET output transistor $Q_3$. The output data $b_3$ of the logic signal circuit 120 is applied to a gate of the N-FET $Q_3$, and the input end of the logic signal circuit 120 is connected to an input/output terminal 16 of the IC 19 jointly with the drain of the N-FET $Q_3$. The two IC's 18 and 19 are directly coupled by connecting the input/output terminals 13 and 16 to a data bus line 17 and to a positive voltage source +V via a pull-up resistor $R_2$. In this case, the reference terminal 14 of the IC 18 and the second power supply terminal 112 are connected to a reference potential terminal of a power supply, that is, to the ground and the first power supply terminal 111 of the IC 18 is connected to a positive potential terminal +V of the power supply.

Now it is assumed that a signal is to be transmitted from the IC 18 to the IC 19. Then, the N-FET $Q_3$ is maintained in a cut-off condition by being supplied at its gate with "0" level of the data $b_3$. In the output section 11 of the IC 18, the exclusive OR 12 operates as a non-inverter, because its one input end 14 is applied with the ground potential. Accordingly, if the signal applied to its other input end 15 is represented by $D_3$, and the output $a_3'$ of the exclusive OR 12 at its output end 12' is the same level as that of $D_3$, and the output $O_3$ of the output transistor $Q_4$ is in the inverted level with respect to its input $a_3$. Thus these signals $D_3$, $a_3$ and $O_3$ fulfil the relation represented by a truth table shown in Table-2 below.

TABLE 2

| $D_3$ | $a_3$ | $O_3$ |
|---|---|---|
| 0 | 0 | 1 |
| 1 | 1 | 0 |

In this way, the transfer of signals from the IC 18 to the IC 19 can be perfectly executed.

Signal transfer from the IC 19 to the IC 18 is also achieved by maintaining the N-FET $Q_4$ in a cut-off condition by making $D_3$ "0" level. The relation between the output signal $b_3$ of the circuit 120 (input of $Q_3$) and the output signal $O_3$ of the output transistor $Q_3$ in this case is similar to the relation between the signal $a_3$ and the signal $O_3$ in Table-2.

Figure 4:
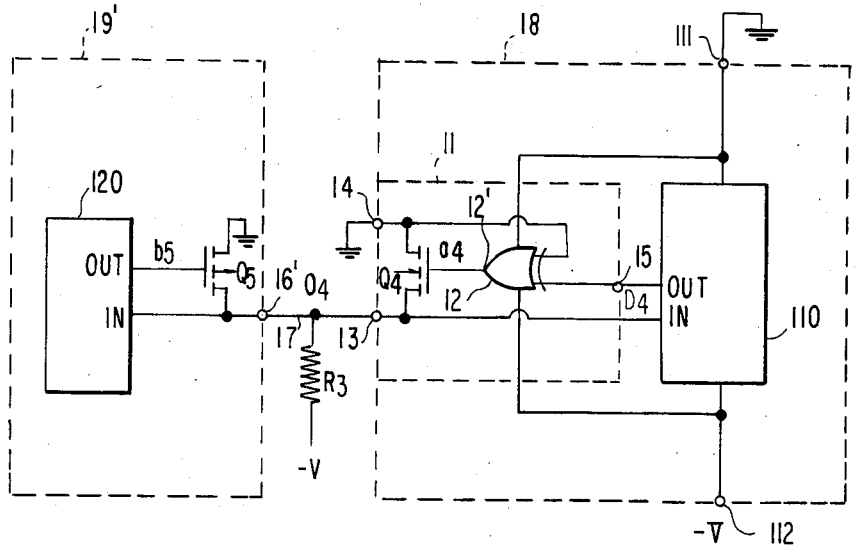
FIG. 4 is a circuit diagram of the IC according to the first preferred embodiment of the present invention which is connected to another IC having an output transistor of the opposite conduction type.

FIG. 4 shows the case where the same IC 18 as that shown in FIG. 3 is connected to another IC 19' including a P-FET $Q_5$ as an output transistor which receives an output $b_5$ of a logic signal circuit 120' and is connected between ground and an input/output terminal 16' of the IC 19'. The two IC's are directly coupled by connecting both the input/output terminals 13 and 16' to the bus line 17 and to a negative potential $-V$ via a pull-up resistor $R_3$. In this case, the reference terminal 14 and the first power supply terminal 111 of the IC 18 are held at the ground potential and the second power supply terminal 112 of the IC 18 takes a negative potential of $-V$. Consequently, the terminal 14 is maintained at a higher potential (level "1" in the P-FET IC, at level "0" in the N-FET IC), and the exclusive OR 12 operates as an inverter.

When transfer of signals is to be effected from the IC 18 to the IC 19', the P-FET $Q_5$ is maintained in a cut-off condition by being supplied at its gate with a "1" level potential, i.e., a ground potential. Under this condition, the signal $D_4$ at the terminal 15 is inverted by the exclusive OR circuit 12, and the output $a_4$ of the exclusive OR 12 is not inverted by the output transistor $Q_4$ and appears at the terminal 13 as an output data $O_4$. Therefore, these signals $D_4$, $a_4$ and $O_4$ fulfil the relation of a truth table shown in Table-3 below.

TABLE 3

| $D_4$ | $a_4$ | $O_4$ |
|---|---|---|
| 0 | 1 | 1 |
| 1 | 0 | 0 |

It is to be noted that in this case since the substrate potential of the N-FET $Q_4$ is equal to $-V$, the N-FET $Q_4$ operates as a source-follower. Accordingly, inversion between the signals $a_4$ and $O_4$ does not occur. The "1" level of $a_4$ makes $Q_4$ conductive to make $O_4$ at the ground level, that is "1" level of P-FET. The relation between the signals $D_4$ and $O_4$ is identical to the relation between the signals $D_3$ and $O_3$ in Table-2. In this way, signal transfer from the IC 18 to the IC 19' can be perfectly executed.

On the contrary, in the case where signals are transferred from the IC 19' to the IC 18, the N-FET $Q_4$ is maintained in a cut-off condition. Since the substrate potential of the P-FET $Q_5$ is the ground potential, the P-FET $Q_5$ operates as an inverter. It is noted that the "1" level, ground potential makes the P-FET $Q_5$ non-conductive to make $O_4$ at $-V$ potential, i.e., "0" level potential. Hence the relation of the signals $b_5$ and $O_4$ is the same as that of $D_4$ and $O_4$ shown in Table-3. Thus, exchange of signals can be achieved in either direction between the IC 18 and the IC 19' by merely changing relative potentials at the terminals 13 and 14 and at the power supply terminals 111 and 112 as compared to the case shown in FIG. 3.

In this way, the IC 18 can arbitrarily exchange signals with either the IC 19 having the N-FET $Q_3$ as an output transistor or the IC 19' having the P-FET $Q_5$ as an output transistor. It is to be noted that when the IC 18 is connected to the IC 19' having the P-FET $Q_5$, since the N-FET $Q_4$ operates as a source follower, the output signal obtained at the terminal 13 becomes lower than a normal level by the magnitude of the threshold voltage $V_T$ of the N-FET $Q_4$. Such lowering of an output signal level can be prevented by raising the output voltage of the logic circuit 110 by the magnitude of the threshold voltage $V_T$ or by raising the operating power supply voltage for the exclusive OR 12 by the magnitude of the threshold voltage $V_T$ with respect to a normal value.

Figure 5:
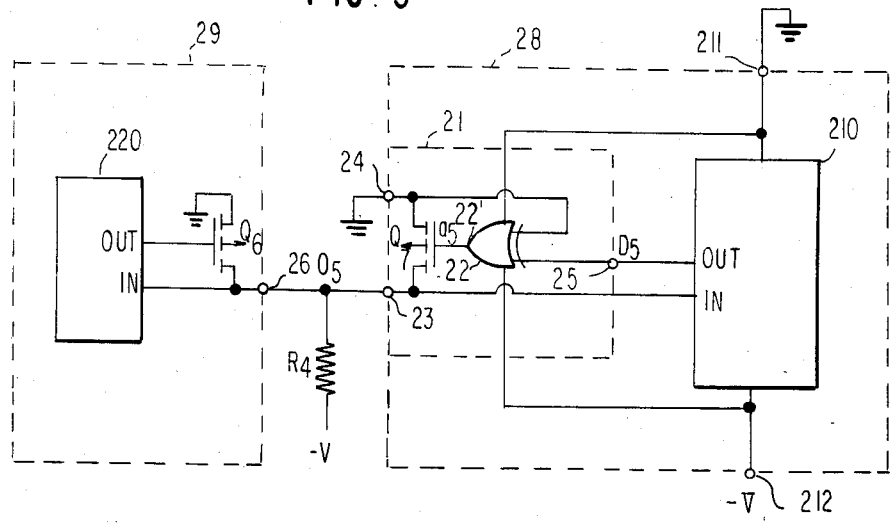
FIG. 5 is a circuit diagram of an IC according to a second preferred embodiment of the present invention having a P-channel type field-effect output transistor in the case of being connected to another IC having an output transistor of the same conduction type.
Figure 6:
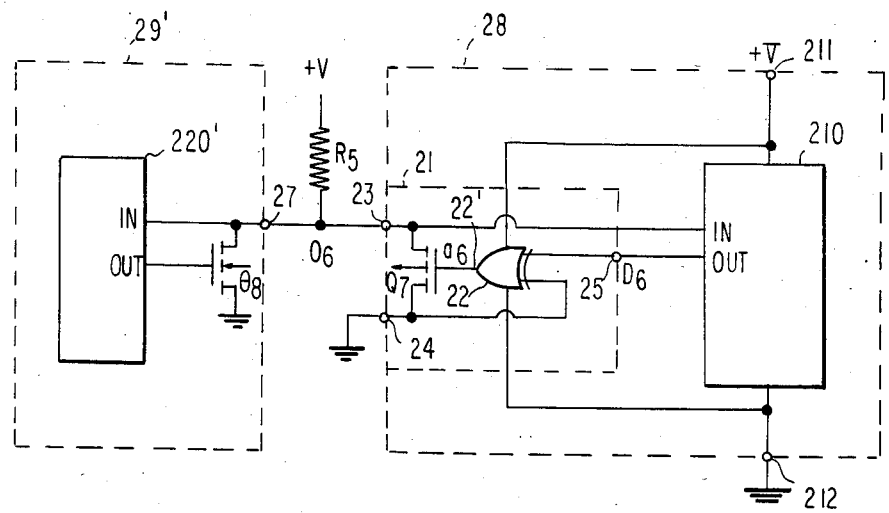
FIG. 6 is a circuit diagram of the IC according to the second preferred embodiment of the present invention which is connected to another IC having an output transistor of the opposite conduction type.

FIGS. 5 and 6, respectively, show connections of an IC 28 employing P-FET's according to a second embodiment of the invention to another IC 29 employing P-FET's and another IC 29' employing N-FET's, respectively. At first, with reference to FIG. 5, a logic circuit 210 and an exclusive OR 22 are formed of P-FET's. The connecting relation between a P-FET $Q_7$ serving as an output transistor and the exclusive OR 22 within an output circuit 21 is the same as that in the output circuit shown in FIG. 3 or 4, that is, an output from the logic circuit 210 is applied to one input end 25 of the exclusive OR 22, and the other input end of this exclusive OR 22 is connected to a terminal 24 jointly with the source of the P-FET $Q_7$ and is grounded. The input of the logic circuit 210 is connected to a terminal 23 which is connected with the drain of the P-FET $Q_7$. In the IC 29, similarly to the IC 19 described previously, an output of a logic signal circuit 220 is connected to a gate of a P-FET $Q_6$, and its input is connected to the drain of the P-FET $Q_6$ and a terminal 26. The terminals 23 and 26 are both connected to a pull-down resistor $R_4$, and exchange of signals is effected by the intermediary of these terminals 23 and 26.

Figure 11:
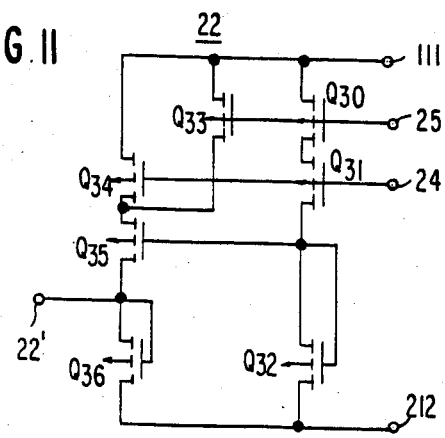
FIGS. 11 and 12 are circuit diagrams of examples of the exclusive OR circuit to be used in the P-channel MOS IC according to the second embodiment.
Figure 12:
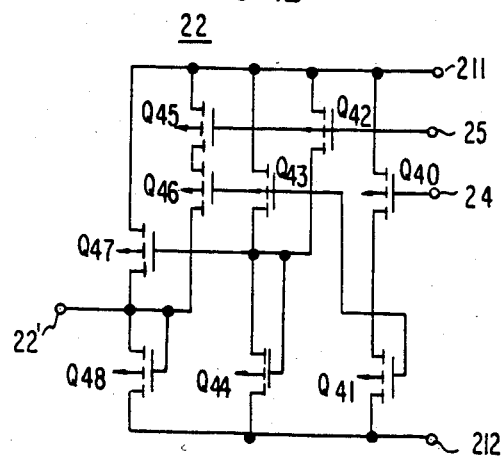

Examples of the exclusive OR used P-FET's are shown in FIGS. 11 and 12. The first example includes a first NOR gate of P-FET's $Q_{30}$ and $Q_{31}$ *and an AND gate of P-FET's* $Q_{33}$ and $Q_{34}$. This AND gate and another P-FET $Q_{35}$ which receives an output of the first NOR gate forms a second NOR gate. Two input signals are applied to the two inputs 24 and 25 and an output are derived at the output 22' from the second NOR gate. The depletion type P-FET's $Q_{32}$ and $Q_{36}$ operate as loads of the first NOR gate and the second NOR gate. The terminals 211 and 212 are power supply terminals. The second example includes an inverter of P-FET's $Q_{40}$ and $Q_{41}$, a first NAND gate of P-FET's $Q_{42}$ and $Q_{43}$, an OR gate of P-FET's $Q_{45}$ and $Q_{46}$ and a second NAND gate of the output of the OR gate and another P-FET $Q_{47}$ which receives the output of the first NAND gate. The depletion type P-FET $Q_{41}$ is a load of the inverter, and two depletion type P-FETs $Q_{44}$ and $Q_{48}$ operate as loads of the first and second NAND gates, respectively. Two inputs are applied to the inputs 24 and 25, respectively, and an output is derived at the output 22' from the second NAND gate. In both FIGS. 11 and 12, all the P-FET's except for the depletion type P-FET's $Q_{32}$, $Q_{36}$, $Q_{41}$, $Q_{44}$ and $Q_{48}$ are FET's of enhancement type.

Now referring back to FIG. 5, since the substrate potentials of the P-FET's forming the IC 28 are maintained at the ground potential which is a higher potential in this case, the exclusive OR 22 operates as a non-inverter. Assuming now that signals are to be transferred from the IC 28 to the IC 29, then the P-FET $Q_6$ is maintained in a cut-off condition. Under such a condition, if a signal at the junction point 25 is represented by $D_5$, the output of the exclusive OR 22 is represented by $a_5$ and a signal appearing at the terminal 23 (or 26) is represented by $O_5$, then the truth table as shown in Table-4 below is fulfilled.

TABLE 4

| $D_5$ | $a_5$ | $O_5$ |
|---|---|---|
| 1 | 1 | 0 |

TABLE 4-continued

| $D_5$ | $a_5$ | $O_5$ |
|---|---|---|
| 0 | 0 | 1 |

On the contrary, if it is intended to transfer signals from the IC 29 to the IC 28, then the P-FET $Q_7$ in the IC 28 is maintained in a cut-off condition. Since the P-FET $Q_6$ acts as an inverter, the input-output relation of the P-FET $Q_6$ is similar to the relation between the signal $D_5$ and the signal $O_5$ in Table-4. In this way, exchange of signals is possible in either direction between the IC 28 and the IC 29.

With reference to FIG. 6, an IC 29' is formed of N-FET's, and an output of a logic signal circuit 220' is received by a gate of an N-FET $Q_8$ and is output from a terminal 27. A signal input through the terminal 27 is itself applied to the logic signal circuit 220'. An IC 28 is formed of P-FET's similarly to that shown in FIG. 5, and it is exactly identical to the IC 28 shown in FIG. 5. The only difference exists in the application of the ground potential and hence in the relative potential of the terminal 24. To the terminal 24 is applied the ground potential which is a lower potential in this case, while the substrate potentials of the component P-FET's are maintained at $+V$ which is a higher potential, and therefore, the exclusive OR 22 acts as an inverter and the P-FET $Q_7$ acts as a source-follower. Hence in the case of transmitting signals from the IC 28 to the IC 29', the N-FET $Q_8$ is then maintained in a cut-off condition. If a signal at the junction point 25 is represented by $D_6$, an output of the exclusive OR 22 is represented by $a_6$ and a signal appearing at the terminal 23 (or 27) is represented by $O_6$, then the truth table shown in Table-5 is fulfilled.

TABLE 5

| $D_6$ | $a_6$ | $O_6$ |
|---|---|---|
| 1 | 0 | 0 |
| 0 | 1 | 1 |

Paying attention to the relation between the signal $D_6$ and the signal $O_6$, it is identical to the relation between the signal $D_5$ and the signal $O_5$ in Table-4.

Now considering the case where signals are transferred from the IC 29' to the IC 28, in this case the P-FET $Q_7$ is maintained in a cut-off condition. Since the N-FET $Q_8$ acts as an inverter, the relation between the signals at its gate and at its drain is quite identical to the relation between the signal $D_6$ and the signal $O_6$ in Table-5.

As described above, the output circuit 21 employing the P-FET $Q_7$ as an output transistor also can perfectly achieve exchange of signals with either the IC 29 employing the P-FET $Q_6$ as an output transistor or the IC 29' employing the N-FET $Q_8$ as an output transistor, by merely changing a relative potential at the terminal 24. It is to be noted that in the case of FIG. 6, since the P-FET $Q_7$ acts as a source-follower, when signals are transmitted from the IC 28 to the IC 19', the output level is raised by the magnitude of the threshold voltage $V_T$ of the P-FET $Q_7$. In order to prevent this, it is only necessary that the output of the logic circuit 210 is lowered by the magnitude of the threshold voltage $V_T$ or the operating power supply voltage for the exclusive OR 22 is lowered by the maginitude of the threshold voltage $V_T$.

Figure 7:
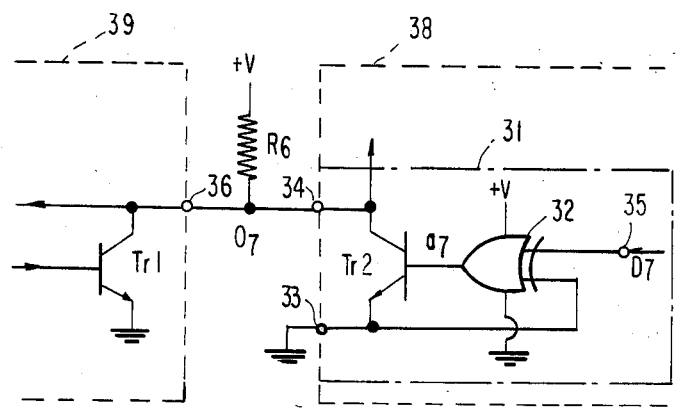
FIG. 7 is a circuit diagram of a bipolar IC according to a third preferred embodiment of the present invention having a NPN type bipolar output transistor in the case of being connected to another IC having a bipolar output transistor of the same conduction type.
Figure 8:
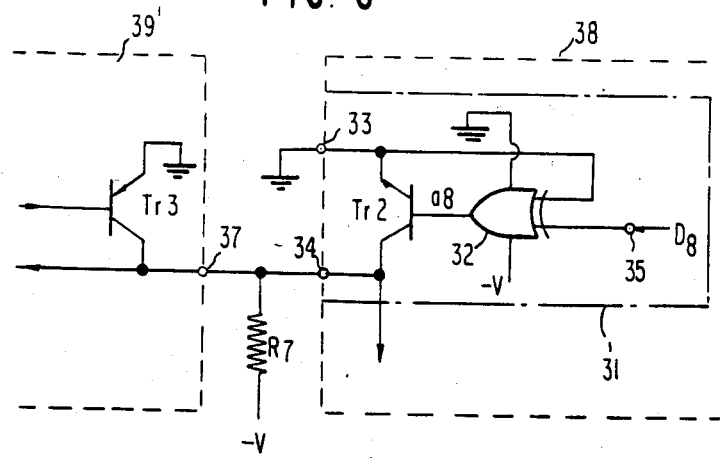
FIG. 8 is a circuit diagram of the bipolar IC according to the third preferred embodiment of the present invention which is connected to another IC having a bipolar output transistor of the opposite conduction type.

FIGS. 7 and 8 show another preferred embodiment of the present invention is applied to bipolar IC's. At first, with reference to FIG. 7, an output circuit 31 in an IC 38 is formed of a lateral NPN transistor $T_{r2}$ in which a collector and an emitter are arranged laterally within a base region and an exclusive OR 32. To one input end of the exclusive OR 32 is applied a signal $D_7$ via a junction point 35 which signal is to be output, and the other input end thereof is connected to a terminal 33 jointly with the emitter of the NPN transistor $T_{r2}$, and is grounded. The collector of the NPN transistor $T_{r2}$ is connected to a terminal 34. On the other hand, in another IC 39 also, an NPN transistor $T_{r1}$ is employed as an output transistor, and a signal to be output is applied to the base of the NPN transistor $T_{r1}$. The collector of the NPN transistor $T_{r1}$ is connected to a terminal 36, while a signal received at the terminal 36 to be input to the IC 39 is in itself applied to an internal circuit of the IC 39. The terminals 34 and 36 are connected to a pull-up resistor $R_6$ in common.

Now, it is assumed that signals are to be transferred from the IC 38 to the IC 39. Then the NPN transistor $T_{r1}$ in the IC 39 is maintained in a cut-off condition. Since the ground potential is applied to the terminal 33, the exclusive OR 32 operates as a non-inverter. If the signal to be output which is applied to a junction point 35 is represented by $D_7$, the output of the exclusive OR 32 is represented by $a_7$ and the output signal is represented by $O_7$, then these signals fulfil the relation indicated in the truth table shown in Table-6 below.

TABLE 6

| $D_7$ | $a_7$ | $O_7$ |
|---|---|---|
| 0 | 0 | 1 |
| 1 | 1 | 0 |

The output signal $O_7$ is inverted with respect to the signal $D_7$ to be output by the inverter action of the NPN transistor $T_{r2}$. Considering now the case where signals are transferred from the IC 39 to the IC 38, in this case the NPN transistor $T_{r2}$ is maintained in a cut-off condition. In the IC 39, the signal to be output is inverted by the NPN transistor $T_{r1}$, and hence, a relation similar to the relation between the signal $D_7$ to be output and the output signal $O_7$ in Table-6 is established between the base and the collector of the NPN transistor $T_{r1}$.

The state where the same IC 38 is connected to another IC 39' employing a PNP transistor $T_{r3}$ as an output transistor, is shown in FIG. 8. On the side of the IC 38, although the terminal 33 is grounded like the above-mentioned cases, the higher potential end of a power supply voltage applied to the exclusive OR 32 is grounded and the lower potential end thereof is held at $-V$. Accordingly, the NPN transistor $T_{r2}$ achieves an inverse transistor action in which the emitter of the transistor acts as a collector and its collector acts as an emitter. Therefore, a lateral transistor which has a large current gain $h_{FE}$ in an inverse transistor action, is favorable, and the conventional vertical transistor is not so effective. On the side of the IC 39', a PNP transistor $T_{r3}$ is employed as an output transistor, and its collector is connected to a terminal 37. The terminals 34 and 37 are both connected to a pull-down resistor $R_7$.

Considering now the case where signals are transferred from the IC 38 to the IC 39, in this case the PNP transistor $T_{r3}$ is maintained in a cut-off condition. Since the terminal 33 is maintained at the ground potential which is a higher potential in this case, the exclusive OR 32 acts as an inverter. Accordingly, a signal $D_8$ to be output which is applied to the junction point 38, is inverted and derived as an output $a_8$ of the exclusive OR 32. Since the NPN transistor $T_{r2}$ operates as an emitter-follower, the output $a_8$ is not inverted and is derived from the terminal 34 as an output $O_8$. The relation between these signals fulfils the truth table shown in Table-7 below.

TABLE 7

| $D_8$ | $a_8$ | $O_8$ |
|---|---|---|
| 0 | 1 | 1 |
| 1 | 0 | 0 |

Next, considering the case where signals are transferred from the IC 39' to the IC 38, in this case the NPN transistor $T_{r2}$ in the IC 38 is maintained in a cut-off condition. Since the PNP transistor $T_{r3}$ merely acts as an inverter, the relation between the signals at its base and at its collector is identical to the relation between the signal $D_8$ to be output and the output signal $O_8$ in Table-7.

In this way, exchange of data between the IC 38 and the IC 39' can be achieved perfectly. It is to be noted that the output from the IC 38 is lowered in output level by the magnitude of the emitter-base forward voltage $V_{BE}$ due to the emitter-follower operation of the NPN transistor $T_{r2}$. In order to compensate for this lowering in the output level, it is only necessary to raise the signal $D_8$ to be output or to raise the operating power supply voltage for the exclusive OR 32 by the corresponding amount.

As described above, the IC 38 having the output circuit 31 can achieve exchange of signals bidirectionally either with the IC 39 employing an NPN transistor $T_{r1}$ as an output transistor or with the IC 39' employing a PNP transistor $T_{r3}$ as an output transistor, by merely changing a relative potential at the terminal 33.

While description has been made above with respect to the case where an output circuit is formed of an exclusive OR and an output transistor, in place of the exclusive OR, an exclusive NOR could be employed. However, in the event that an exclusive NOR is employed, since the exclusive NOR operates as an inverter when the exclusive OR operates as a non-inverter and operates as a Non-Inverter when the exlusive OR operates as an inverter, it is only necessary to invert the relative potential applied to the terminal 14, 24 or 23 with respect to that applied in the above-described preferred embodiments.

As described in detail above, the output circuit according to the present invention has a great advantage that it enables a wired NOR connection to be made while maintaining a sufficient operation performance, either with a semiconductor device of the same conduction type as a matter of course, or with a semiconductor device of different conduction type which was difficult to be connected in the prior art.

What is claimed is:

1. An integrated circuit comprising:
   an input/output terminal;
   a common terminal;
   an internal circuit outputting a logic signal;
   an output transistor having a common electrode, a control electrode and an output electrode;
   an exclusive OR circuit having its one input terminal connected to the common electrode of said transistor and the other input terminal applied with said logic signal from said internal circuit;

means for connecting the output terminal of said exclusive OR circuit to the control electrode of said transistor;

means for connecting the output electrode of said transistor to said input/output terminal;

means for connecting the common electrode of said transistor to said common terminal; and means for connecting said input/output terminal to said internal circuit.

2. An integrated circuit as claimed in claim 1, in which said output transistor is a field effect transistor.

3. An integrated circuit as claimed in claim 1, in which said output transistor is a bipolar transistor.

4. An output comprising a transistor having a common electrode, a control electrode and an output electrode, an exclusive NOR circuit having its one input end connected to the common electrode of said transistor and the other input end applied with a signal to be output, means for connecting the output of said exclusive NOR circuit to the control electrode of said transistor, and an output terminal connected to the output electrode of said transistor, said transistor being selected from the group consisting of a field-effect transistor and a lateral bipolar transistor.

5. An integrated circuit comprising an electrical circuit having an input section and an output section, an exclusive OR circuit having its one input end connected to the output section of said electrical circuit, a transistor having a common electrode connected to the other input end of said exclusive OR circuit, a control electrode connected to the output end of said exclusive OR circuit and an output electrode connected to the input section of said electrical circuit, a first terminal connected to the common electrode of said transistor, and a second terminal connected to the output electrode of said transistor, said transistor being selected form the group consisting of a field-effect transistor and a lateral bipolar transistor.

6. An integrated circuit as claimed in claim 5, in which said transistor is a field effect transistor.

7. An integrated circuit as claimed in claim 5, in which said transistor is a bipolar transistor.

8. An integrated circuit as claimed in claim 5, wherein said electrical circuit is a microprocessor circuit.

9. An integrated circuit as claimed in claim 5, wherein said electrical circuit is a digital memory.

10. An integrated circuit, as claimed in claim 5, 6, 7, 8 or 9 wherein the output of said exclusive OR circuit is inverted, whereby said exclusive OR circuit operates as an exclusive NOR circuit.

11. An integrated circuit comprising:

a logic circuit having an input terminal and an output terminal, a reference potential terminal, an input/output terminal, an output transistor of one conductivity type whose current path is coupled between said reference potential terminal and said input/output terminal and having a control electrode, means for connecting said input terminal of said logic circuit to said input/output terminal, means coupled to said output terminal of said logic circuit for applying to said control electrode of said output transistor a logic signal of the same polarity as that of the logic signal at said output terminal when said input/output terminal of said integrated circuit is connected to a circuit with a transistor of said one conductivity type and of the opposite polarity when said input/output terminal is connected to a circuit with a transistor of the opposite conductivity type, and power source terminals connected to said logic circuit.

12. An integrated circuit as claimed in claim 11, in which said output transistor is an N-channel type field-effect transistor, said input/output terminal being biased at a positive potential and said first and second power terminals being connected to a positive power source and a reference potential, respectively, when said input/output terminal is connected to an N-channel type field-effect transistor circuit, and said input/output terminal being biased at a negative potential and said first and second power terminals being connected to a reference potential and a negative power source, respectively, when said input/output terminal is connected to a P-channel type field-effect transistor circuit.

13. An integrated circuit as claimed in claim 11, in which said output transistor is a P-channel type field-effect transistor, said input/output terminal being negatively biased and said first and second power terminals being supplied with a reference and a negative potentials, respectively, when said input/output terminal is connected to a P-channel type field-effect transistor circuit, and said input/output terminal being positively biased and said first and second power terminals being supplied with a positive and a reference potentials, respectively, when said input/output terminal is connected to an N-channel type field-effect transistor circuit.

* * * * *